United States Patent [19]

Ishida

[11] Patent Number: 5,304,817

[45] Date of Patent: Apr. 19, 1994

[54] SUPERCONDUCTIVE CIRCUIT WITH FILM-LAYERED JOSEPHSON JUNCTION AND PROCESS OF FABRICATION THEREOF

[75] Inventor: Ichiro Ishida, Tokyo, Japan

[73] Assignee: NEC Corporation, Tokyo, Japan

[21] Appl. No.: 886,949

[22] Filed: May 22, 1992

[30] Foreign Application Priority Data

May 24, 1991 [JP] Japan ................. 3-119677

[51] Int. Cl.$^5$ ............................................. H01L 39/22
[52] U.S. Cl. ........................................ 257/31; 257/33; 257/661
[58] Field of Search ................. 257/31, 33, 663, 661

[56] References Cited

U.S. PATENT DOCUMENTS 5,194,419  3/1993  Shiga et al. .................... 257/31

FOREIGN PATENT DOCUMENTS

| 59-194482 | 11/1984 | Japan | 257/31 |
| 1-11376 | 1/1989 | Japan | 257/33 |
| 3-165078 | 7/1991 | Japan | 257/31 |

OTHER PUBLICATIONS

H. Akoh et al, "Anisotropic Josephson junctions of Y-Ba-Cu-O/Au/Nb film sandwiches", Appl. Phys. Lett. 56 (15), Apr. 9, 1990, pp. 1487-1489.

*Primary Examiner*—Jerome Jackson
*Assistant Examiner*—Courtney A. Bowers
*Attorney, Agent, or Firm*—Sughrue, Mion, Zinn, Macpeak & Seas

[57] ABSTRACT

A superconductive circuit is fabricated on a substrate with a major surface, and comprises a wiring layer of superconductive oxide with the a-b plane orientation substantially parallel to the major surface, and a Josephson junction electrically coupled with the wiring layer, wherein the josephson junction comprises a lower electrode of superconductive oxide having the a-b plane orientation substantially perpendicular to the major surface and embedded into the wiring layer so that the structure achieves both long coherent length desirable for large design margin of the junction as well as large amount of current passing through the wiring layer.

7 Claims, 4 Drawing Sheets

SUPERCONDUCTIVE CIRCUIT WITH FILM-LAYERED JOSEPHSON JUNCTION AND PROCESS OF FABRICATION THEREOF

FIELD OF THE INVENTION

This invention relates to a superconductive circuit and, more particularly, to a Josephson junction fabricated from a superconductive oxide film, a barrier film and a metal film accompanied with a wiring layer of superconductive oxide.

DESCRIPTION OF THE RELATED ART

A typical example of the film-layered Josephson junction is reported by H. Akoh et al in "Anisotropic Josephson junctions of Y-Ba-Cu-O/Au/Nb films sandwiches", Applied physics letters, vol. 56, No. 15, 9 Apr. 1990, pages 1487 to 1489. According to the letter, the film-layered Josephson junction was fabricated on a $SrTiO_3$ substrate, and comprises a Y-Ba-Cu-O film on the substrate, an Au barrier film on the Y-Ba-Cu-O film and a Nb counter electrode held in contact with the Au barrier film. The Y-Ba-Cu-0 film partially serves as a lower electrode of the Josephson junction, and the remaining portion propagates superconductive current as a wiring. In the fabrication process, the Y-Ba-Cu-O film is epitaxially grown on the $SrTiO_3$ substrate, and, for this reason, the lower electrode of the Josephson junction and the wiring are identical in crystal orientation with each other.

In general, superconductive oxide with the perovskite crystal structure has different coherence lengths depending upon the crystal orientation. For example, the coherence length along the a-b plane orientation Lab is longer than the coherence length Lc along the c-axis orientation. The characteristics of the Josephson junction are affected by the orientation of the superconductive oxide. For example, if the a-b plane orientation Lab extends along the perpendicular direction of the Josephson junction, the design margin for the Josephson junction is enhanced, and, accordingly, the a-b plane orientation is desirable in view of the Josephson junction. On the other hand, the maximum superconductive current density Jab flowing on the a-b surface is larger than the maximum superconductive current density Jc flowing along the c-axis. For this reason, it is preferable for the wiring layer to extend along the a-b plane in view of the maximum superconductive current density.

However, since the prior art Josephson junction disclosed by Akoh et al uses the Y-Ba-Cu-O film for both wiring and Josephson junction, there is a trade-off between the design margin for the Josephson junction and the maximum current density. Namely, if the Y-Ba-Cu-O film is oriented in such a manner as to enhance the design margin for the Josephson junction, the current flows in the direction perpendicular to the a-b plane, and the maximum superconductive current density is relatively small. On the other hand, if the Y-Ba-Cu-O film is oriented in such a manner as to increase the maximum superconductive current density, the coherence length is relatively short rather than that of the a-b plane orientation, and the design margin for the Josephson junction is deteriorated.

SUMMARY OF THE INVENTION

It is therefore an important object of the present invention to provide a film-layered Josephson junction which not only provides a large design margin to a designer but also achieves large superconductive current density.

It is also an important object of the present invention to provide a process of fabricating the film-layered Josephson junction.

To accomplish the object, the present invention proposes to orient crystal structures of superconductive oxides for a wiring layer and a lower electrode, respectively.

In accordance with one aspect of the present invention, there is provided a superconductive circuit fabricated on a substrate with a major surface, comprising: a) a wiring layer formed on the major surface of the substrate and of first superconductive oxide with the a-b plane orientation substantially parallel to the major surface of the substrate, and having a hollow space open at an upper surface thereof and defined by an oblique surface with respect to the major surface; and b) a film-layered Josephson junction having b-1) a lower electrode filling the hollow space of the wiring layer, and formed of second superconductive oxide with the a-b plane orientation substantially perpendicular to the a-b plane orientation of the first superconductive oxide, b-2) a barrier film covering the lower electrode, and b-3) an upper electrode formed on the barrier film.

In accordance with another aspect of the present invention, there is provided a process of fabricating a superconductive circuit with a film-layered Josephson junction, comprising the steps of: a) preparing a substrate having a major surface; b) depositing first superconductive oxide over the major surface of the substrate in such a manner that the a-b plane orientation of the first superconductive oxide is substantially parallel to the major surface of the substrate for providing a wiring layer; c) forming a hollow space in the wiring layer and open at an upper surface of the wiring layer, the hollow space being defined by an oblique surface with respect to the major surface; d) filling the hollow space with second superconductive oxide in such a manner that the a-b plane orientation of the second superconductive oxide is substantially perpendicular to the a-b plane orientation of the first superconductive oxide for providing a lower electrode of the film-layered Josephson junction; and e) forming a multi-level structure having a barrier film on the lower electrode and an upper electrode on the barrier film for completing said film-layered Josephson junction.

BRIEF DESCRIPTION OF THE DRAWINGS

The features and advantages of the Josephson junction with the film-layered structure according to the present invention will be more clearly understood from the following description taken in conjunction with the accompanying drawings in which.

DESCRIPTION OF THE PREFERRED EMBODIMENTS

First Embodiment

Figure 1:
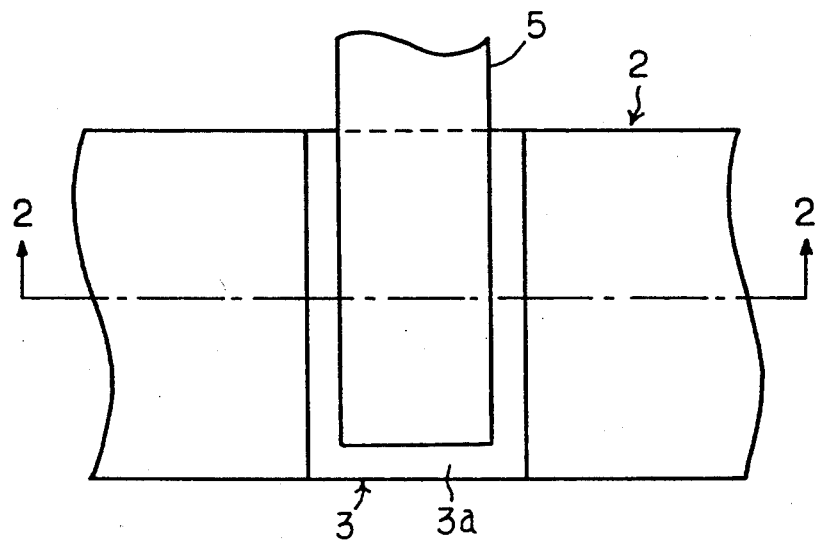
FIG. 1 is a plane view showing the layout of a Josephson junction according to the present invention.
Figure 2:
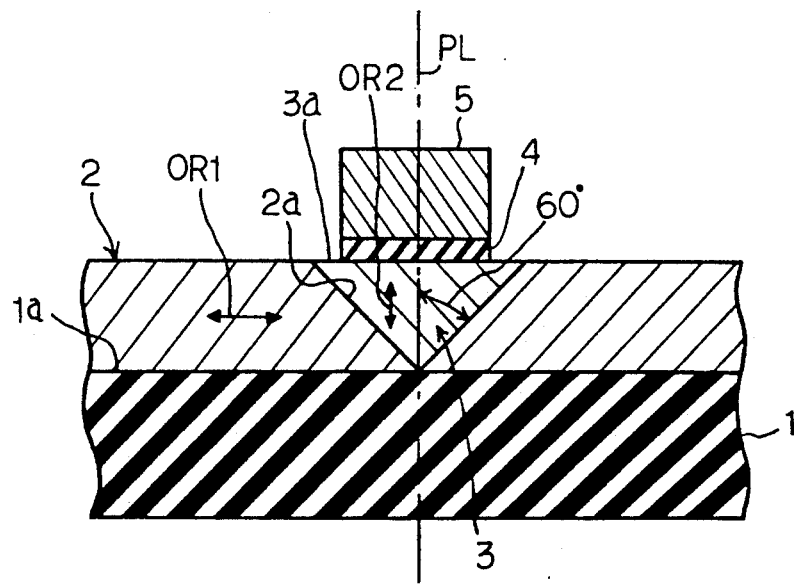
FIG. 2 is a cross sectional view taken along line A—A of FIG. 1 and showing the structure of the Josephson junction.

Referring first to FIGS. 1 and 2 of the drawings, a superconductive circuit embodying the present invention is fabricated on a substrate 1 formed of $SrTiO_3$, and the substrate 1 has a major surface 1a. On the major surface 1a of the substrate 1 is formed a wiring layer 2 which is formed of superconductive oxide expressed by the molecular formula of $YBa_2Cu_3O_x$ where x ranges from about 6 to about 7. The superconductive oxide has the perovskite crystal structure and the a-b plane orientation OR1 substantially parallel to the major surface 1a. The wiring layer 2 is about 10 microns in width and about 500 nanometers in thickness. A hollow space is formed in the wiring layer 2, and the hollow space is defined by an oblique surface 2a. In this instance, the oblique surface 2a extends at about 60 degrees with respect to a virtual line PL substantially perpendicular to the major surface 1a and, accordingly, to the a-b plane orientation OR1.

The wiring layer 2 is electrically coupled with a film-layered Josephson junction. A lower electrode 3 is formed in the hollow space and formed of the superconductive oxide expressed as $YBa_2Cu_3O_x$ where x ranges from about 6 to about 7. However, the a-b plane orientation OR2 for the lower electrode 3 is substantially perpendicular to the a-b plane orientation OR1. The upper surface 3a of the lower electrode 3 is partially covered with a tunnel barrier film 4 of silicon dioxide, and the tunnel barrier film 4 is about 1 nanometer in thickness. On the tunnel barrier film 4 is formed an upper electrode 5 of Nb which is about 200 nanometers in thickness. Though not shown in the drawings, an insulating film covers the exposed upper surfaces and exposed side surfaces of the wiring layer 2 and the tunnel barrier film 4.

The superconductive oxide expressed as $YBa_2Cu_3O_{6-7}$ has long coherence length Lab along the a-b plane orientation rather than the c-axis orientation, and the maximum superconductive current density Jab on the a-b plane is larger than the maximum superconductive current density Jc along the c-axis. Therefore, the wiring layer 2 allows a large amount of current to flow therealong, and the current flows out from the oblique surface 2a. This means that the current is directed toward the upper surface 3a of the lower electrode 3. The current flows from the lower electrode 3 through the tunnel barrier film 4 into the upper electrode 5 along the a-b plane orientation OR2, and the lower electrode 3 provides the long coherent length Lab for the current.

Description is hereinbelow made on a process sequence for fabricating the superconductive circuit shown in FIGS. 1 and 2 with reference to FIGS. 3A to 3E. The process sequence starts with preparation of the substrate 1 of $SrTiO_3$, and the major surface 1a is oriented to (100) surface. The substrate 1 is heated to about 400 degrees in centigrade, and superconductive oxide expressed as $YBa_2Cu_3O_x$ is deposited to thickness of about 500 nanometers on the major surface 1a of the substrate 1 by using a vacuum evaporation. The suffix x ranges from about 6 to about 7. The a-b plane orientation OR1 is substantially parallel to the major surface 1a of the substrate 1. A photo-resist mask 31 is patterned on the upper surface of the superconductive oxide film 30, and exposes a junction forming area 30a. The resultant structure of this stage is illustrated in FIG. 3A.

Figure 3A:
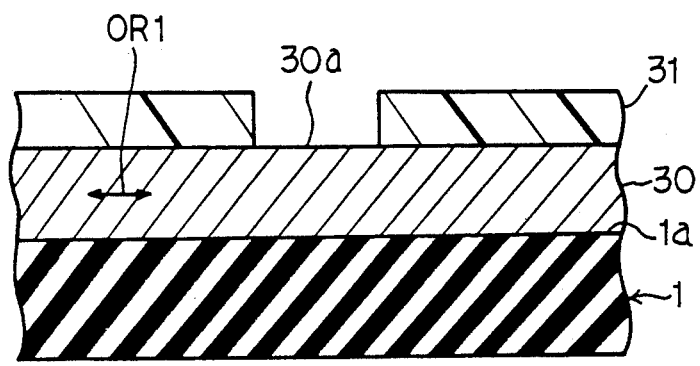
FIGS. 3A to 3E are cross sectional views showing a process sequence for fabricating the Josephson junction shown in FIGS. 1 and 2.
Figure 3B:
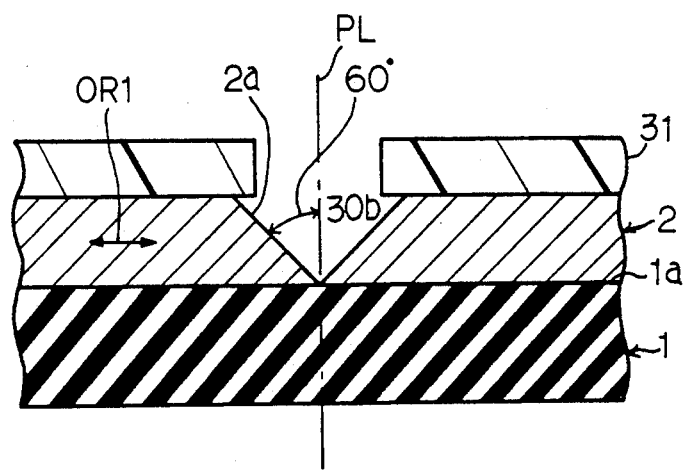

The structure shown in FIG. 3A is subjected to plasma-assisted ion etching, and the plasma-assisted reactive ion etching is carried out in etchant gas containing $CCl_2F_4$ at 15 Pa. The plasma is created under the electric power density of 0.16 watt/$cm^2$. The junction forming area 30a of the superconductive oxide film 30 is isotropically etched away, and a hollow space 30b is left in the superconductive oxide film 30. The remaining superconductive oxide film 30 provides the wiring layer 2, and the hollow space 30b is defined by the oblique surface 2a. The oblique surface 2a is about 60 degrees with respect to the virtual line PL substantially perpendicular to the major surface 1a and, accordingly, to the a-b plane orientation OR1. The resultant structure of this stage is illustrated in FIG. 3B.

Figure 3C:
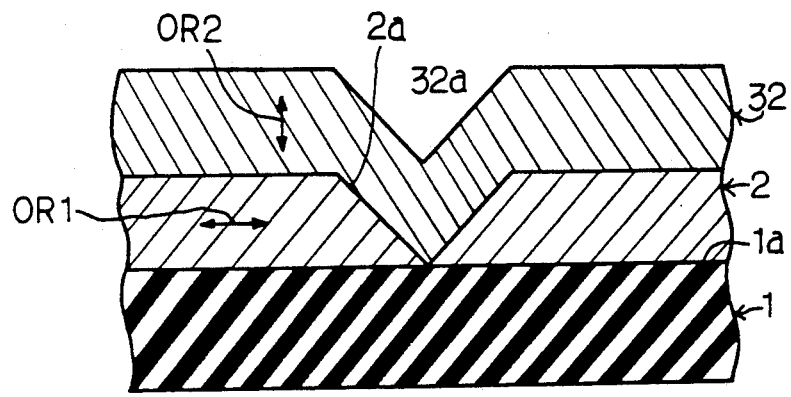

The photo-resist mask 31 is stripped off, and superconductive oxide expressed as $YBa_2Cu_3O_x$ is sputtered on the entire surface of the wiring layer 2 to thickness of about 500 nanometers. The suffix x also ranges from about 6 to about 7. The superconductive oxide film 32 has the a-b plane orientation OR2 substantially perpendicular to the major surface 1a and, accordingly, to the a-b plane orientation OR1. The superconductive oxide film 32 is so conformal that a hollow space 32a takes place. The resultant structure of this stage is illustrated in FIG. 3C.

Figure 3D:
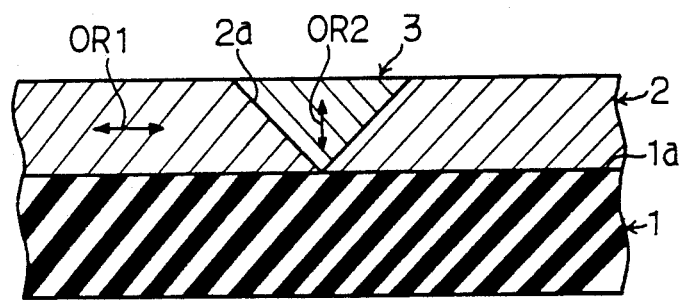

Photo-resist of positive type is spin-coated so that the hollow space 32a is filled with the photo-resist. The upper surface of the photo-resist is substantially coplanar with the upper surface of the superconductive oxide film 32. The exposed superconductive oxide film 32 is uniformly etched away by using an etch-back technique in argon ambience until the wiring layer 2 is exposed, and the lower electrode 3 is left in the wiring layer 2 as shown in FIG. 3D.

Figure 3E:
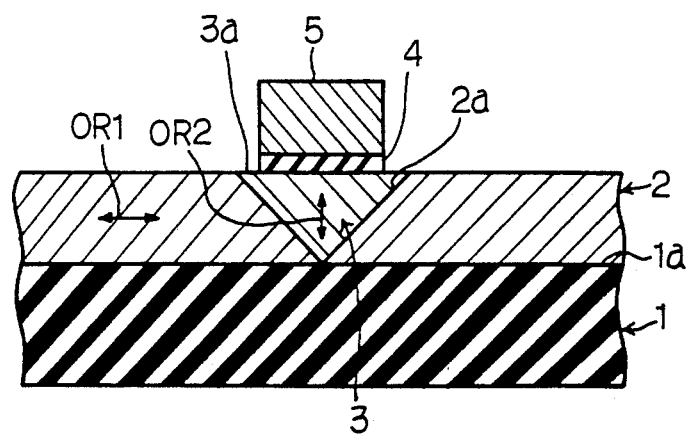

Electrical insulator (not shown) is deposited on the entire surface, and the electrical insulator film is uniformly etched so as to create a smooth surface, and the electrical insulator film covers the side surfaces of the wiring layer 2 and the lower electrode 3. A silicon dioxide film is deposited to thickness of 1 nanometer on the entire upper surface of the structure shown in FIG. 3D, and a niobium film is subsequently deposited over the silicon dioxide film to thickness of about 200 nanometers. A plasma-assisted reactive ion etching is applied to the niobium film and the silicon dioxide film so as to pattern these films, and the tunnel barrier film 4 and the upper electrode 5 are patterned on the lower electrode 3 as shown in FIG. 3E.

As will be understood from the foregoing description, the wiring layer 2 has the a-b plane orientation OR1 substantially parallel to the direction of current flowing therethrough, and the lower electrode 3 has the a-b plane orientation OR2 substantially perpendicular to the upper surface 3a thereof. Then, the superconductive circuit according to the present invention allows a large amount of current to flow through the wiring layer 2, and enhances the design margin of the Josephson junction.

Second Embodiment

Figure 4:
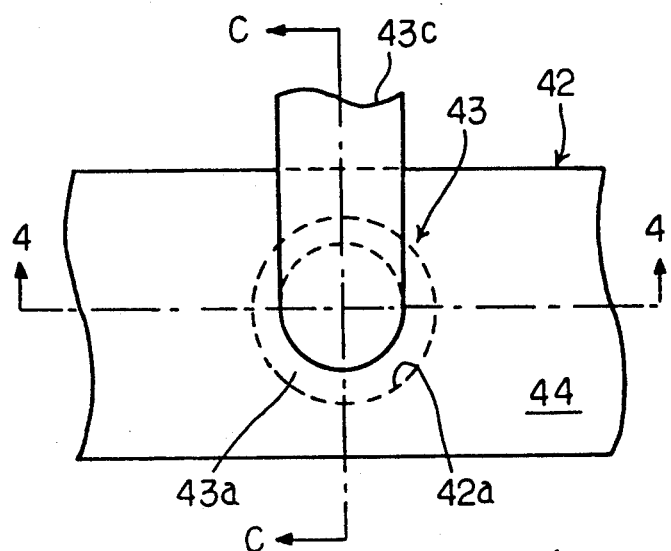
FIG. 4 is a plan view showing the layout of another Josephson junction according to the present invention.
Figure 5:
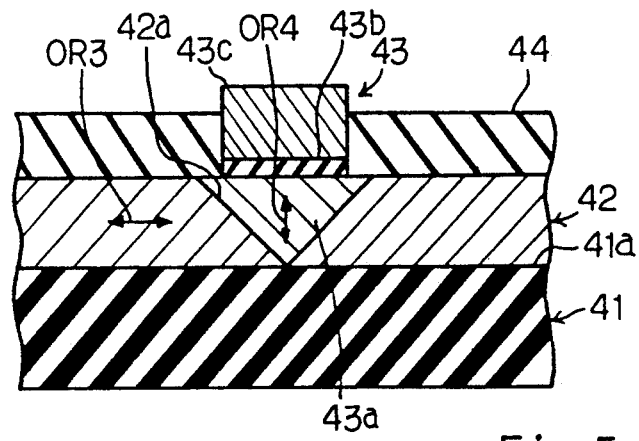
FIG. 5 is a cross sectional view taken along line B—B of FIG. 4 and showing the structure of the Josephson junction shown in FIG. 4.
Figure 6:
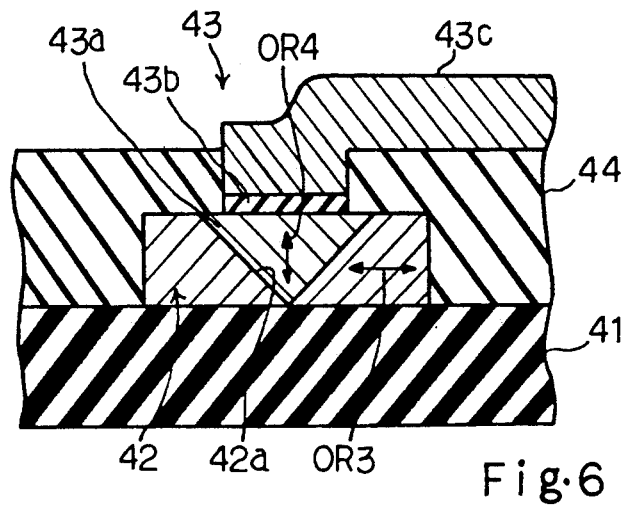
FIG. 6 is a cross sectional view taken along line C—C of FIG. 4 and showing the structure from a different angle.

Turning to FIGS. 4 to 6, another superconductive circuit embodying the present invention is fabricated on a substrate of $SrTiO_3$, and comprises a wiring layer 42 and a Josephson junction 43. The wiring layer is formed of yttrium-barium-copper oxide expressed as $YBa_2Cu_3O_x$ where x ranges from about 6 to about 7. The yttrium-barium-copper oxide film 42 has the a-b plane orientation OR3 substantially parallel to the major surface 41a of the substrate 41. The wiring layer 42 is about 10 microns in width and about 500 nanometers in thickness. An inverted circular cone-shaped hollow space 42a is formed in the wiring layer 42, and the cone surface 42a declines at about 45 degrees with respect to a virtual line substantially perpendicular to the major surface 41a. The hollow space 42a is filled with superconductive oxide expressed as $YBa_2Cu_3O_x$ where x ranges from about 6 and about 7, and this superconductive oxide has the a-b plane orientation OR4 substantially perpendicular to the major surface 41a and, accordingly, to the orientation OR3. The superconductive oxide filling the inverted circular cone-shaped hollow space 42a serves as a lower electrode 43a of the Josephson junction 43. On the lower electrode 43a is formed a tunnel barrier film 43b which is overlain by an upper electrode 43c. The tunnel barrier film 43b is about 1 nanometer in thickness, and is formed of silicon dioxide. The upper electrode 43c is about 200 nanometers in thickness, and is formed of niobium. The exposed surface of the wiring layer 42, the exposed surface of the lower electrode 43a, the tunnel barrier film 43b and part of the upper electrode 43c are covered with an insulating film 44.

The hollow space 42a may be a cone with a cross section except for circle. A tunnel barrier film may be held in contact with part of the upper surface of a wiring layer as well as the entire surface of a lower electrode embedded thereinto. In this instance, after formation of the tunnel barrier film, an insulating film is deposited over the tunnel barrier film, and is selectively removed so that an upper electrode is formed on the tunnel barrier film.

Although particular embodiments of the present invention have been shown and described, it will be obvious to those skilled in the art that various changes and modifications may be made without departing from the spirit and scope of the present invention. For example, a tunnel barrier film may be formed of conductive metal or semiconductor, and an upper electrode may be formed of superconductive oxide. Moreover, although the oblique surface 2a extends across the wiring layer 2, an oblique surface of another implementation may merely extend part of the thickness of the wiring layer.

What is claimed is:

1. A superconductive circuit fabricated on a substrate with a major surface, comprising:
    a) a wiring layer formed on the major surface of said substrate and formed of first superconductive oxide with the a-b plane orientation substantially parallel to the major surface of said substrate, and having a hollow space open at an upper surface thereof and defined by an oblique surface with respect to said major surface; and
    b) a film-layered Josephson junction having b-1) a lower electrode filling said hollow space of said wiring layer, and formed of second superconductive oxide with the a-b plane orientation substantially perpendicular to said a-b plane orientation of said first superconductive oxide, b-2) a barrier film covering said lower electrode, and b-3) an upper electrode formed on said barrier film.

2. A superconductive circuit as set forth in claim 1, in which said wiring layer and said lower electrode are formed of yttrium-barium-copper oxide.

3. A superconductive circuit as set forth in claim 2, in which said yttrium-barium-copper-oxide is expressed by the molecular formula of $YBa_2Cu_3O_x$ where x ranges from about 6 to about 7.

4. A superconductive circuit as set forth in claim 2, in which said oblique surface extends at about 60 degrees with respect to a virtual line substantially perpendicular to said major surface of said substrate.

5. A superconductive circuit as set forth in claim 4, in which said barrier film and said upper electrode are respectively formed of silicon dioxide and niobium.

6. A superconductive circuit as set forth in claim 2, in which said oblique surface extends at about 45 degrees with respect to a virtual line substantially perpendicular to said major surface of said substrate.

7. A superconductive circuit as set forth in claim 6, in which an exposed surface of said wiring layer, an exposed surface of said lower electrode, an exposed surface of said barrier film and an exposed surface of a lower portion of said upper electrode are covered with an insulating film.

* * * * *